US012701940B2

(12) United States Patent
Chen et al.

(10) Patent No.: US 12,701,940 B2
(45) Date of Patent: Aug. 4, 2026

(54) METAL WIRES AND METHODS FOR MANUFACTURING THE SAME

(71) Applicants: Beijing BOE Technology Development Co., Ltd., Beijing (CN); BOE Technology Group Co., Ltd., Beijing (CN)

(72) Inventors: Jiangbo Chen, Beijing (CN); Hai Yu, Beijing (CN); Tuo Sun, Beijing (CN); Shuo Zhang, Beijing (CN); Zeyuan Li, Beijing (CN); Kui Liang, Beijing (CN); Fanli Meng, Beijing (CN); Yanzhao Li, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/775,714

(22) PCT Filed: May 28, 2021

(86) PCT No.: PCT/CN2021/096928
§ 371 (c)(1),
(2) Date: May 10, 2022

(87) PCT Pub. No.: WO2022/246836
PCT Pub. Date: Dec. 1, 2022

(65) Prior Publication Data
US 2024/0153782 A1      May 9, 2024

(51) Int. Cl.
*H10P 50/00* (2026.01)
*H10W 20/00* (2026.01)
*H10W 20/41* (2026.01)

(52) U.S. Cl.
CPC .......... *H10P 50/71* (2026.01); *H10W 20/058* (2026.01); *H10W 20/435* (2026.01)

(58) Field of Classification Search
None
See application file for complete search history.

(56) References Cited

U.S. PATENT DOCUMENTS

| | | | | |
|---|---|---|---|---|
| 5,717,251 A | * | 2/1998 | Hayashi | .............. H01L 23/5329 |
| | | | | 257/386 |
| 6,534,789 B2 | * | 3/2003 | Ishida | ............... H01L 21/32139 |
| | | | | 257/E29.147 |

(Continued)

FOREIGN PATENT DOCUMENTS

| | | |
|---|---|---|
| CN | 1405856 A | 3/2003 |
| CN | 1992150 A | 7/2007 |

(Continued)

OTHER PUBLICATIONS

LNF Wiki, "Wet etching".*
Machine Translation of KR0174945B1 (Year: 1999).*
Wet Etching LNF Wiki (Year: 2020).*

*Primary Examiner* — Yara B Green
*Assistant Examiner* — Fakeha Sehar
(74) *Attorney, Agent, or Firm* — IPro, PLLC

(57) ABSTRACT

The present disclosure provides a metal wire and a method for manufacturing the same. The method for manufacturing the metal wire includes: forming a metal bar on a substrate; forming a mask above the metal bar, a width of the mask being smaller than a width of the metal bar, and an orthographic projection of the mask on the substrate is within an orthographic projection of the metal bar on the substrate; and wet etching the metal bar to a saturation state under a protection of the mask to form a metal wire, a width of the (Continued)

metal wire being smaller than the width of the mask. The above method can form the metal wire with a high thickness and a narrow line width.

17 Claims, 11 Drawing Sheets

(56)                          References Cited

U.S. PATENT DOCUMENTS

| | | | | |
|---|---|---|---|---|
| 2002/0132451 A1* | 9/2002 | Akino | ................. | H01L 21/2007 |
| | | | | 438/735 |
| 2004/0036835 A1* | 2/2004 | Lee | ........................... | C23F 1/02 |
| | | | | 349/187 |
| 2004/0240106 A1* | 12/2004 | Iitsuka | ................. | G11B 5/3906 |
| | | | | 360/123.41 |
| 2006/0260945 A1* | 11/2006 | Miyake | ................ | G11B 5/3163 |
| | | | | 205/135 |
| 2007/0155180 A1* | 7/2007 | Hsu | ................... | H01L 21/32139 |
| | | | | 257/E21.309 |
| 2011/0272808 A1* | 11/2011 | Chang | .............. | H01L 21/76885 |
| | | | | 257/E21.582 |
| 2013/0059435 A1 | 3/2013 | Yang et al. | | |
| 2015/0170923 A1* | 6/2015 | Nardi | ................... | H10D 64/017 |
| | | | | 438/745 |

FOREIGN PATENT DOCUMENTS

| | | | |
|---|---|---|---|
| CN | 103034049 A | 4/2013 | |
| JP | 2008130923 A | 6/2008 | |
| KR | 0174945 B1 * | 4/1999 | |

* cited by examiner

METAL WIRES AND METHODS FOR MANUFACTURING THE SAME

CROSS REFERENCE TO RELATED APPLICATIONS

The present application is a US national phase of International patent application No. PCT/CN2021/096928 filed on May 28, 2021, the contents of which are incorporated here in its entirety by reference.

TECHNICAL FIELD

The present disclosure relates to the field of semiconductor technology, in particular to metal wires and methods for manufacturing the same.

BACKGROUND

Under the trend of miniaturization of semiconductor devices, it is a common difficulty in the field to prepare a metal wire/line with a high thickness and a narrow line width for signal transmission.

SUMMARY

According to a first aspect of embodiments of the present disclosure, there is provided a method for manufacturing a metal wire, including:

forming a metal bar on a substrate;

forming a mask above the metal bar, a width of the mask being smaller than a width of the metal bar, and an orthographic projection of the mask on the substrate is within an orthographic projection of the metal bar on the substrate; and wet etching the metal bar to a saturation state under a protection of the mask to form a metal wire, a width of the metal wire being smaller than the width of the mask.

In an embodiment, forming the metal bar on the substrate includes:

forming a sacrificial layer on the substrate, a groove being formed in the sacrificial layer;

filling a metal material in the groove; and removing the sacrificial layer.

In an embodiment, the sacrificial layer is made of a light-sensitive organic material, the groove is formed by photo-etching the sacrificial layer, and the sacrificial layer is removed by ashing.

In an embodiment, the groove has a first section perpendicular to the substrate in a width direction of the groove, and the first section is wide at a top and narrow at a bottom as a whole.

In an embodiment, the first section of the groove is in a shape of isosceles trapezoid.

In an embodiment, filling the metal material in the groove includes:

depositing the metal material on the sacrificial layer and in the groove;

forming a photoresist pattern covering the metal material in the groove and exposing the metal material outside the groove; and perform etching under a protection of the photoresist pattern to remove the metal material outside the groove.

In an embodiment, the mask has a second section perpendicular to the substrate in a width direction of the mask, and the second section is narrow at a top and wide at a bottom as a whole.

In an embodiment, the second section of the mask is in a shape of isosceles trapezoid.

In an embodiment, the substrate includes a Cyclo Olefin Polymer (COP) optical material; and an ashing barrier layer is formed on the substrate before forming the sacrificial layer on the substrate, and the sacrificial layer is formed on the ashing barrier layer.

In an embodiment, the ashing barrier layer includes silicon nitride or silicon oxide.

In an embodiment, a metal seed layer is formed on the substrate before forming the sacrificial layer on the substrate, the sacrificial layer is formed on the metal seed layer, and the groove formed in the sacrificial layer exposes the metal seed layer; and the metal material is filled in the groove by electroplating, and the metal material is not formed outside the groove.

In an embodiment, in a process of wet etching the metal bar to form the metal wire, an exposed part of the metal seed layer is synchronously removed or not synchronously removed.

In an embodiment, forming the metal bar on the substrate includes:

forming a sacrificial layer on the substrate;

forming a first groove and a second groove in the sacrificial layer, the first groove and the second groove being separated from each other and arranged in a width direction of the sacrificial layer; and depositing a metal material, where the metal material formed above the sacrificial layer between the first groove and the second groove serves as the metal bar.

In an embodiment, the sacrificial layer is made of a light-sensitive organic material, and the first groove and the second groove are formed by photo-etching the sacrificial layer.

In an embodiment, a width of the first groove and/or the second groove is greater than or equal to 2 microns, and slopes of sidewalls of the first groove and/or the second groove are greater than or equal to 80 degrees and less than or equal to 90 degrees.

In an embodiment, a hard mask is formed on the sacrificial layer before forming the first groove and the second groove, and the hard mask is formed with openings corresponding to the first groove and the second groove; and the sacrificial layer is dry etched with the hard mask to form the first groove and the second groove in the sacrificial layer.

In an embodiment, the hard mask is removed before depositing the metal material.

In an embodiment, the hard mask includes molybdenum, aluminum, indium tin oxide or indium gallium zinc oxide.

According to a second aspect of the embodiments of the present disclosure, there is provided a metal wire manufactured according to any one of the above methods.

By first forming a specific mask above a metal bar and then wet etching the metal bar to a saturation state to form a metal wire, it is possible to form the metal wire with a high thickness and a narrow line width, while ensuring evenness of the formed metal wire at each part.

DETAILED DESCRIPTION OF THE EMBODIMENTS

Figure 1:
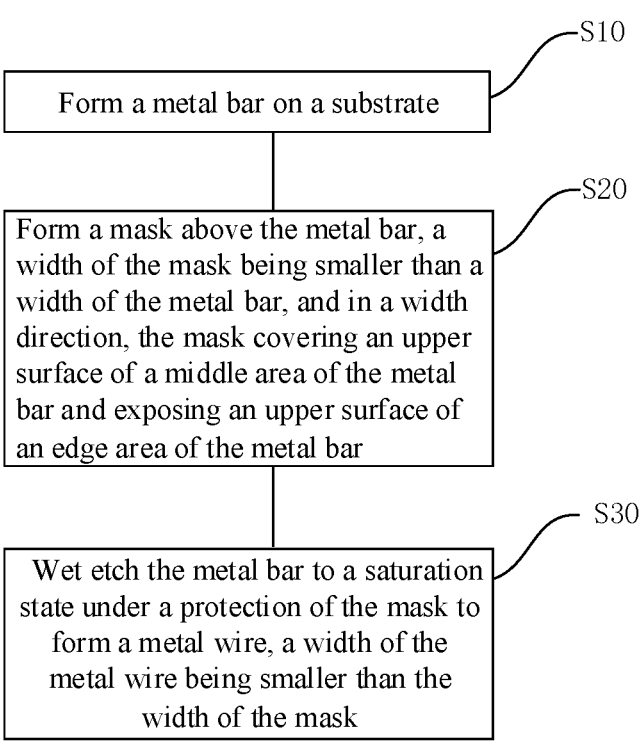
FIG. 1 is a schematic flow diagram illustrating a method for manufacturing a metal wire according to the present disclosure.

Exemplary embodiments will be described in detail herein, examples of which are illustrated in the accompanying drawings. When the following description refers to the drawings, unless otherwise indicated, the same numerals in different drawings indicate the same or similar elements. The exemplary embodiments described below do not represent all embodiments consistent with the present disclosure. Rather, they are merely examples of device and method consistent with some aspects of the present disclosure, as recited in the appended claims.

Terms used in the present disclosure are for the purpose of describing specific embodiments only, and are not intended to limit the present disclosure. The singular forms "a", "the" and "this" used in the present disclosure and the appended claims are also intended to include plural forms, unless the context clearly indicates other meanings. It should also be understood that the term "and/or" as used herein refers to and includes any and all possible combinations of one or more of the associated listed items.

It should be understood that although terms first, second, third, etc. may be used in the present disclosure to describe various information, such information should not be limited to these terms. These terms are only used to distinguish the same type of information from each other. For example, first information may also be referred to as second information, and similarly, the second information may also be referred to as the first information without departing from the scope of the present disclosure. Depending on the context, the word "if" as used herein can be interpreted as "at the time of", "when" or "in response to determining".

The metal wire is usually made of aluminum (Al) and copper (Cu). An etching slope of Al and Cu is about 45 degrees during etching. For a metal wire with a design thickness of 1.5 microns (μm) or more (including 1.5 microns), a usual etching process cannot guarantee evenness of etching. An exposure line width of a common exposure machine is 3 microns (μm) or more, and a metal wire with a high thickness and a narrow line width obtained by a method of directly increasing over-etching cannot guarantee evenness of the line width. A process of double depositing metal and double patterning will cause an obtained metal section to be irregular and uneven, and there will be a serious problem of photoresist peeling off. If epitaxy of an inorganic material, such as silicon nitride (SiN) or silicon oxide (SiO) in small grooves is performed, and then a metal material is evaporated or electroplated into the small grooves, there will be serious defects of uneven line width and thickness.

Therefore, it is necessary to improve the above defects and problems.

The embodiments of the present disclosure will be described in detail below with reference to the accompanying drawings. In case of no conflicts, features in the following embodiments may complement each other or be combined with each other.

The present disclosure provides a method for manufacturing a metal wire/line. As shown in FIG. 1, the method may include the following steps:

S10: a metal bar is formed on a substrate;

S20: a mask is formed above the metal bar, a width of the mask being smaller than a width of the metal bar, and in a width direction, the mask covering an upper surface of a middle area of the metal bar and exposing an upper surface of an edge area of the metal bar; and S30: the metal bar is wet etched to a saturation state under a protection of the mask to form a metal wire, a width of the metal wire being smaller than the width of the mask.

In the above etching, with the continuous progress of etching, the saturation state of etching will appear. After reaching the saturation state of etching, even if etching time is greatly increased, an etching result of the metal bar cannot be significantly changed, and a smaller line width cannot be obtained.

In the above etching process, the appearance of the saturation state of etching is due to the special positional relationship between the mask and the metal bar as well as slowdown of lateral etching caused by a surface tension and diffusion of etching solution. In addition, the above process is relatively stable, that is, after reaching the saturation state of etching, the line width of each part of the metal wire is basically kept at the same level usable for production, and etching results obtained in different batches are also basically stable. With this point, the above method can obtain a metal wire with a high thickness and a narrow line width, and the metal wire has a high evenness of the line width.

It is noted that after reaching the saturation state, it does not mean that continued etching can no longer consume the metal bar at all, but it means that an etching speed that can be obtained by continued etching will be much weaker than that of the previous stable etching stage. Therefore, even if continued etching is kept for a limited period of time, the effect on the final etching result of the metal bar is very small. For example, when the etching speed is significantly lower than the speed or average speed of the previous stable etching stage, such as less than one third of the average speed of the stable etching stage, it can be considered that the saturation state of etching has been reached.

In specific implementation, the step S10 of forming the metal bar on the substrate may include: forming a sacrificial layer on the substrate, a groove being formed in the sacrificial layer; filling a metal material in the groove; and removing the sacrificial layer.

FIGS. 2 to 9 disclose a specific embodiment of the above method for manufacturing the metal wire.

Figure 2:
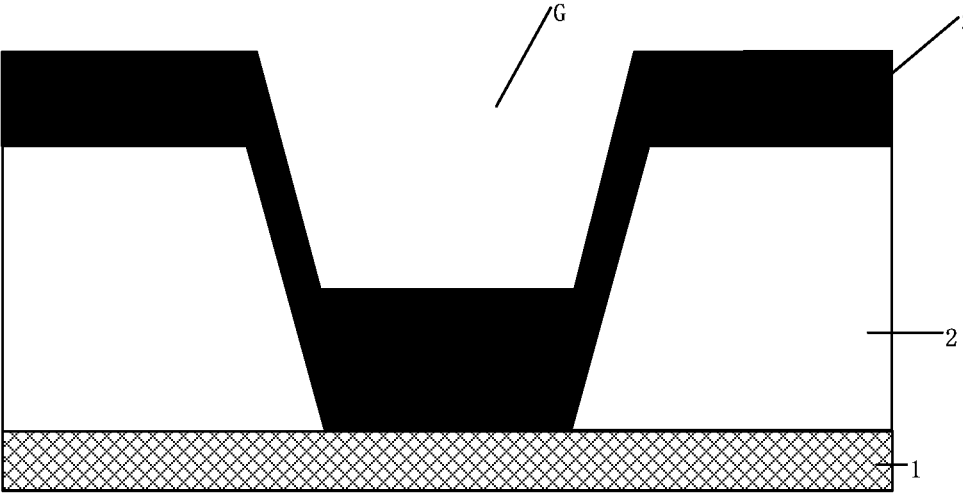
FIGS. 2 to 9 are schematic structural diagrams illustrating a method for manufacturing a metal wire according to an embodiment of the present disclosure.

As shown in FIG. 2, a substrate 1 is provided, and the substrate 1 is glass. In other embodiments, the substrate can also be other rigid or flexible substrate. A sacrificial layer 2 is formed on the substrate 1, and a groove G is formed in the sacrificial layer 2. The sacrificial layer 2 is made of a light-sensitive organic material, and the groove G can be formed in the sacrificial layer 2 by photolithography (including exposure, development, etc.). The groove G penetrates through the sacrificial layer in a thickness direction. In other embodiments, the sacrificial layer can also be made of other organic materials or inorganic materials, as long as it is convenient to form the groove G in the sacrificial layer and remove the sacrificial layer in the subsequent process. The formed groove G has a first section in a shape of isosceles trapezoid that is wide at a top and narrow at a bottom. The first section extends along a width direction of the groove G and is perpendicular to an upper surface of the substrate 1. In other embodiments, the first section of the groove can also have other shapes. However, when the first section is wide at a top and narrow at a bottom as a whole, the finally obtained metal wire has better performance in both shape stability and narrow line width. In the embodiment shown in the drawings, a width of a top of the groove G (i.e., a width at the widest part) is about 7 microns (μm), a width of a bottom of the groove G (i.e., a width at the narrowest part) is about 4.5 microns (μm), and a thickness (i.e., a depth) of groove G is about 5 microns (μm). However, the present disclosure is not limited to this, as long as the thickness of the groove G is greater than the thickness of the final required metal wire.

The above-mentioned groove having the first section in the shape of isosceles trapezoid can be formed by a photo-lithography process and precise control of parameters of the photolithography. The above-mentioned groove having the first section in the shape of isosceles trapezoid can also be formed by pressing and stamping. For example, a stamper which has a convex part can be designed, and the shape of the convex part is the same as that of the groove. When the convex part of the stamper is pressed into the sacrificial layer and then pulled out, a groove with a corresponding shape can be formed in the sacrificial layer.

A metal material is deposited on the sacrificial layer 2, and a deposited thickness meets requirements for design and production. The metal material can be deposited by direct current (DC) sputtering or evaporation, and the deposited metal may be a metal material with high conductivity such as aluminum (Al), copper (Cu), or silver (Ag), etc. In the embodiment shown in the drawings, the deposited metal material is aluminum with a thickness of about 2 microns (μm). As shown in FIG. 2, a metal material layer 3 formed by deposition is both formed on the sacrificial layer 2 and filled in the groove G, but the groove G is not fully filled.

Figure 3:
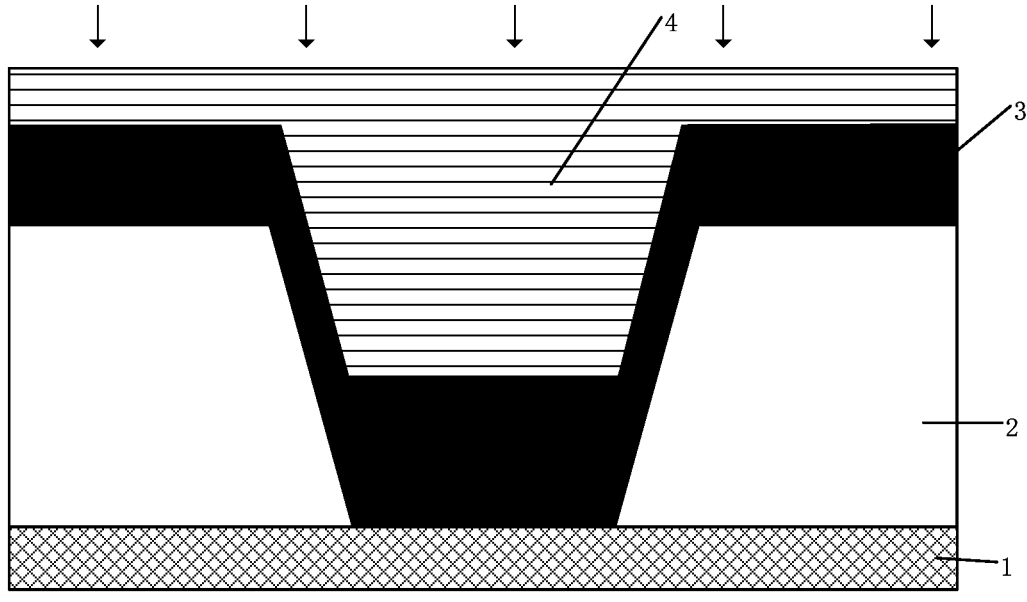
Figure 4:
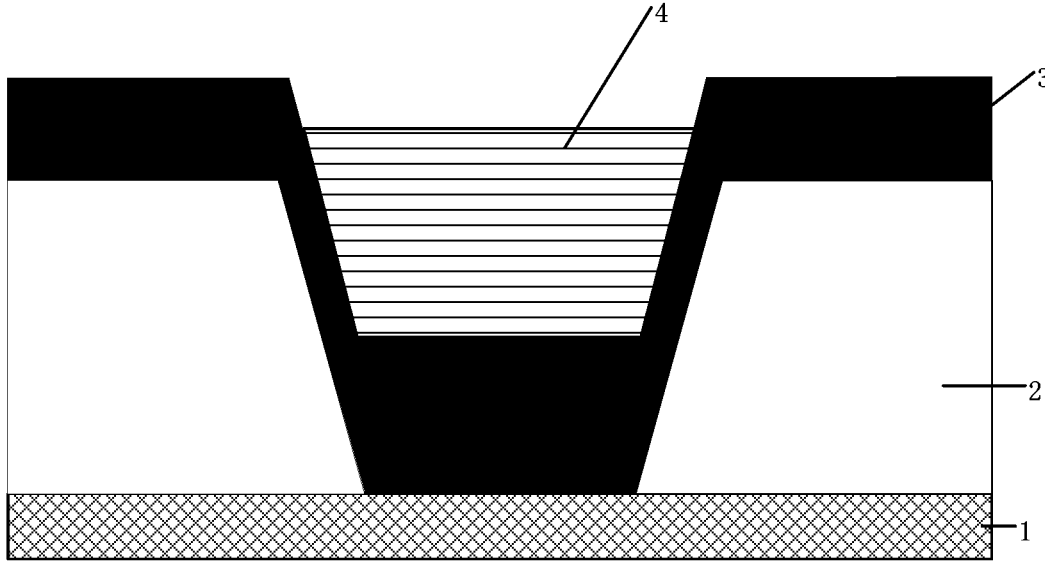

As shown in FIG. 3, the groove G is filled with photoresist 4, and excess photoresist 4 is also formed on the metal material layer 3 outside the groove G. An upper surface of the photoresist 4 is flat as a whole. Subsequently, the entire surface of the photoresist 4 is ashed with oxygen plasma ($O_2$ plasma). By controlling ashing time, the photoresist 4 outside the groove G is completely removed, but the photoresist 4 (photoresist pattern) is still retained on the metal material layer 3 in the groove G. The formed structure is shown in FIG. 4.

Figure 5:
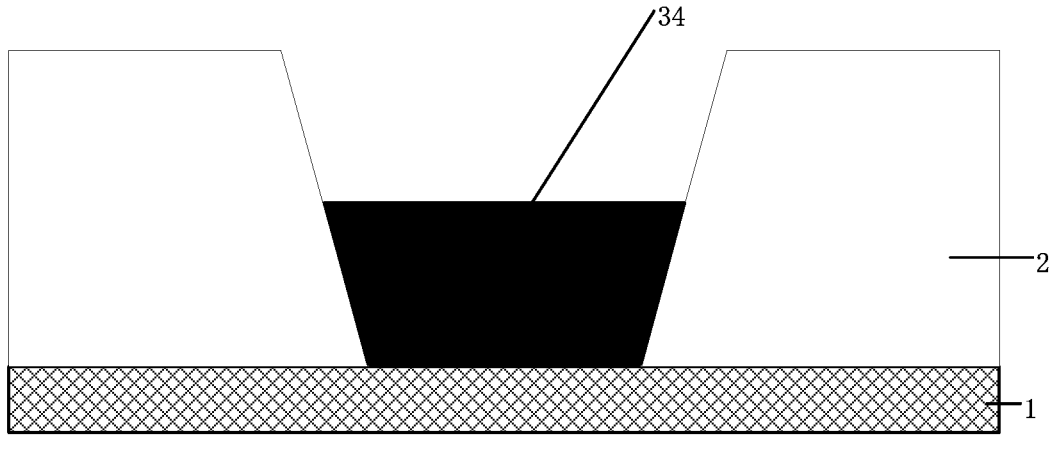

As shown in FIG. 5, wet etching is performed to remove the metal material outside the groove G. Taking the aluminum metal with the thickness of 2 microns in the embodiment in the drawings as an example, all of the metal material outside the groove G can be removed in about 360 seconds. In other embodiments, other methods may also be used to remove the metal material outside the groove G, such as dry etching, chemical mechanical polishing (CMP), or the like.

The photoresist 4 remaining above the metal material in the groove G can then be removed. The metal material still remaining in the groove G at this time may be referred to as a metal bar 34 for convenience of description. In the embodiment shown in the drawings, due to the existence of the groove G, a section of the metal bar 34 is also wide at a top and narrow at a bottom as a whole, and is specifically in a shape of isosceles trapezoid.

Figure 6:
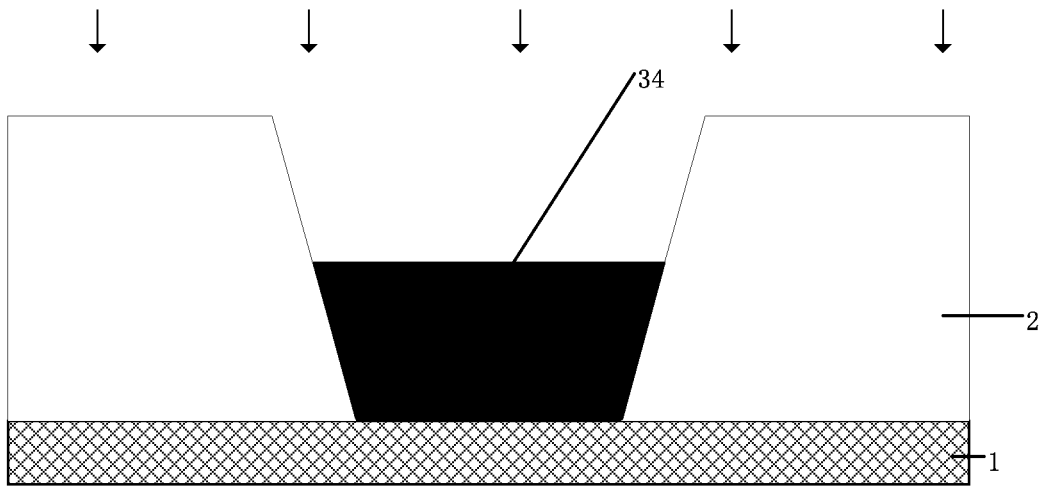
Figure 7:
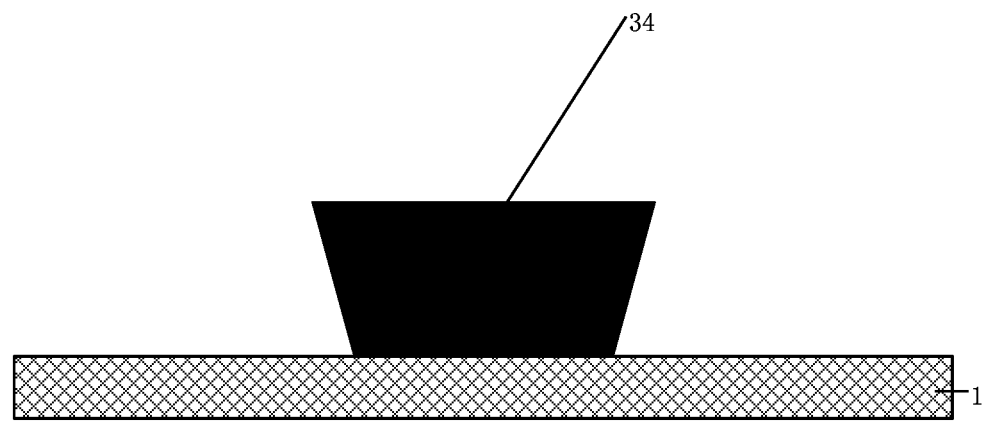

As shown in FIG. 6, the sacrificial layer 2 can be removed by ashing with oxygen plasma ($O_2$ plasma). After the sacrificial layer 2 is removed, sidewalls of the metal bar 34 are exposed. A width of an upper surface of the metal bar 34 is slightly smaller than the width of the top of the groove G, that is, the width of the upper surface of the metal bar 34 is slightly smaller than 7 microns (μm). The formed structure is shown in FIG. 7.

Figure 8:
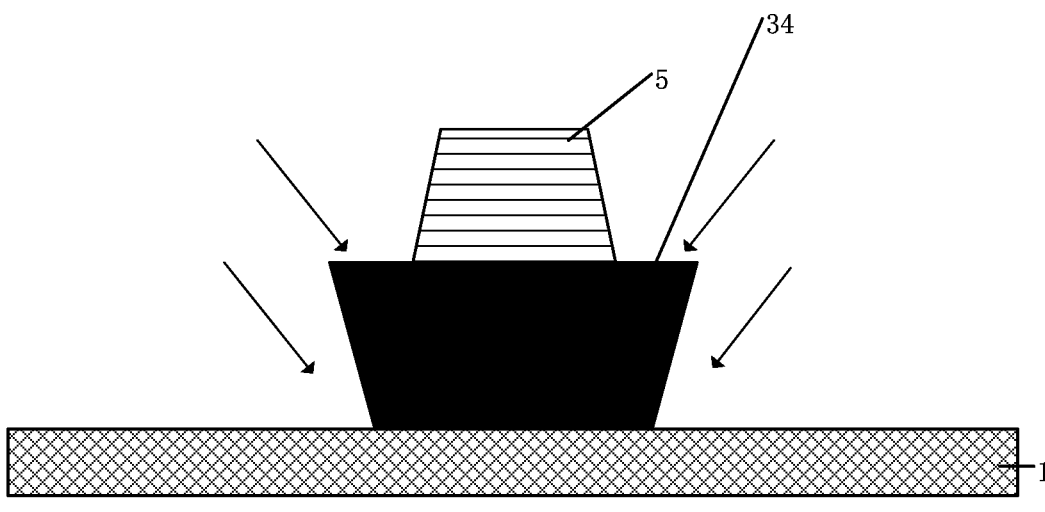

As shown in FIG. 8, a mask 5 is formed on the metal bar 34. A width of the mask 5 is smaller than a width of the metal bar 34, and an orthographic projection of the mask 5 on the substrate 1 is within an orthographic projection of the metal bar 34 on the substrate 1, so that in a width direction, the mask 5 covers an upper surface of a middle area of the metal bar 34 and exposes an upper surface of an edge area of the metal bar 34. In specific implementation, the width of the mask 5 can be designed to be 4 to 6 microns larger than the width of the final required metal wire, that is, both sidewalls of the mask 5 in the width direction protrude outward by 2 to 3 microns relative to sidewalls of the final required metal wire.

"The width of the mask is smaller than the width of the metal bar" mentioned here refers to mainly comparing widths of contact surfaces or adjacent surfaces of the mask and the metal bar. In the specific implementation process, a width of each part of the mask (or the metal bar) is not the same, thus it is not required that the width of each part of the mask is smaller than that of each part of the metal bar. For example, as long as a width of a lower surface of the mask is smaller than the width of the upper surface of the metal bar, it can be considered that "the width of the mask is smaller than the width of the metal bar" is satisfied.

The mask 5 is a photoresist pattern formed after exposure and development of photoresist (i.e., photolithography). In other embodiments, the mask may also be a hard mask or other film layer, as long as it can protect the upper surface of the metal bar 34 to a certain extent in the subsequent wet etching process.

In the embodiment shown in the drawings, the mask 5 has a second section in a shape of isosceles trapezoid that is narrow at a top and wide at a bottom. The second section extends along a width direction of the mask 5 and is perpendicular to the upper surface of the substrate 1. The shape of the second section of the mask 5 is not limited to this. For example, the second section can be in a shape of rectangle, a non-isosceles trapezoid, etc. However, when the second section of the mask 5 is narrow at the top and wide at the bottom, it is more beneficial to obtain a metal wire with a narrower line width in the subsequent wet etching process. The above-mentioned mask 5 having the second section in the shape of isosceles trapezoid can be formed by a photolithography process and precise control of param-eters of the photolithography. The above-mentioned mask 5 having the second section in the shape of isosceles trapezoid can also be formed by pressing and stamping. For example, a stamper with a pit on its pressing surface can be designed, and the shape of the pit is the same as that of the mask 5. When the pressing surface of the stamper is pressed into the photoresist and then pulled out, the photoresist can be pressed to form the mask 5.

Figure 9:
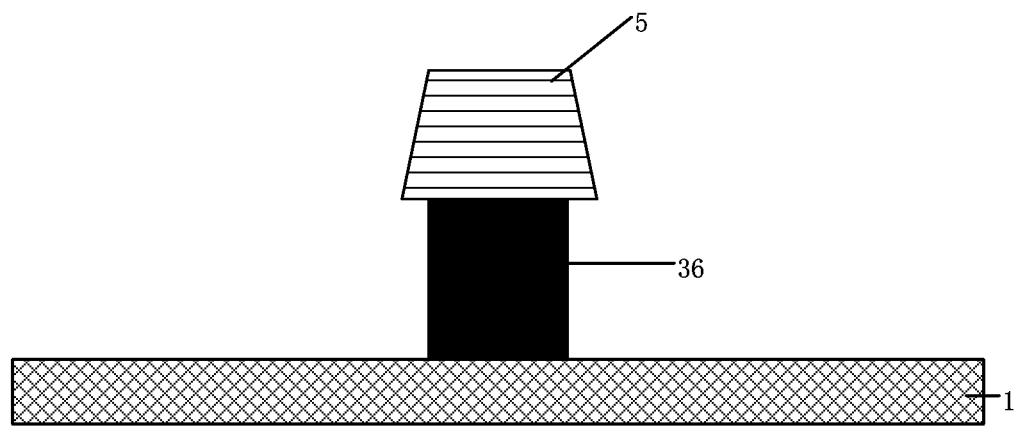

Then, under a protection of the mask 5, referring to FIGS. 8 and 9, the metal bar 34 is wet etched to a saturation state to form a metal wire 36. A width of the metal wire 36 is smaller than the width of the mask 5. The width (i.e., line width) of the finally obtained metal wire 36 is about 1.5 microns (μm).

In the above etching, with the continuous progress of etching, the saturation state of etching will appear. After reaching the saturation state of etching, even if etching time is greatly increased, an etching result of the metal bar 34 cannot be significantly changed, and a smaller line width cannot be obtained.

In the above etching process, the appearance of the saturation state of etching is due to the special positional relationship between the mask 5 and the metal bar 34 as well as slowdown of lateral etching caused by a surface tension and diffusion of etching solution. In addition, the above process is relatively stable, that is, after reaching the saturation state of etching, the line width of each part of the metal wire is basically kept at the same level usable for production, and etching results obtained in different batches are also basically stable. With this point, the above method can obtain the metal wire 36 with a high thickness and a narrow line width, and the metal wire 36 has a high evenness of the line width.

It is noted that after reaching the saturation state, it does not mean that continued etching can no longer consume the metal bar 34 at all, but it means that an etching speed that can be obtained by continued etching will be much weaker than that of the previous stable etching stage. Therefore, even if continued etching is kept for a limited period of time, the effect on the final etching result of the metal bar 34 is very small. For example, when the etching speed is significantly lower than the speed or average speed of the previous stable etching stage, such as less than one third of the average speed of the stable etching stage, it can be considered that the saturation state of etching has been reached.

In the etching of a metal material in the related art, an etching slope of a profile of the metal material is about 45 degrees, which is caused by a difference in etching speeds between upper and lower surfaces of the metal material. In the above process of the present disclosure, for the metal bar 34 originally located in the groove, the contact between upper and lower parts of profiles of the metal bar and etching solution is basically the same. Therefore, the difference in etching speeds between the upper and lower parts of the profiles is small, and finally a metal wire structure with a narrow line width and a high thickness can be realized.

Figure 10:
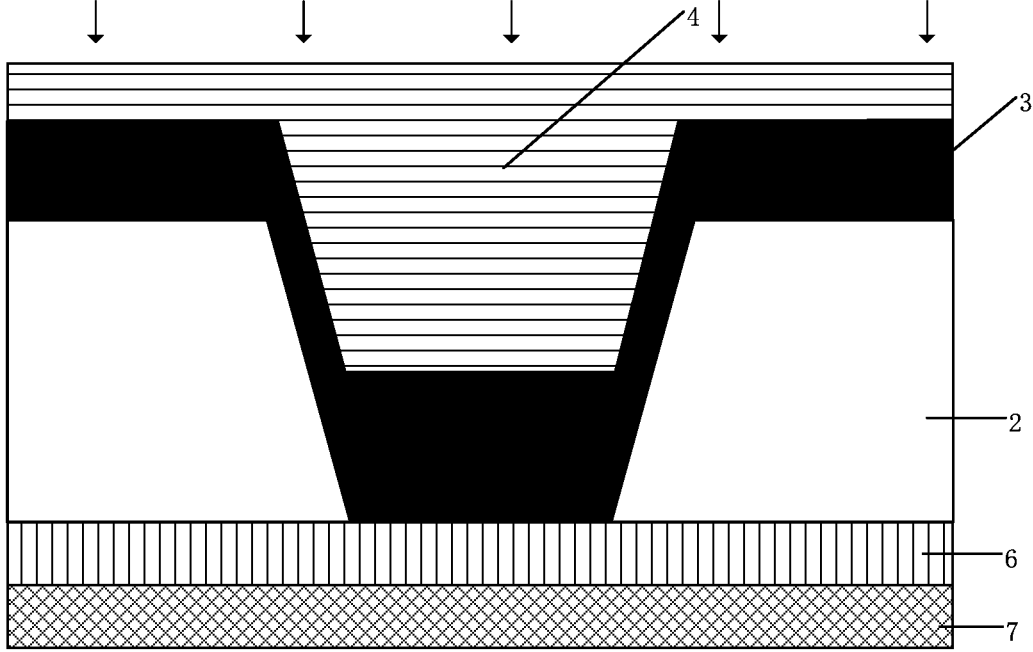
FIGS. 10 to 12 are schematic structural diagrams illustrating a method for manufacturing a metal wire according to another embodiment of the present disclosure.
Figure 11:
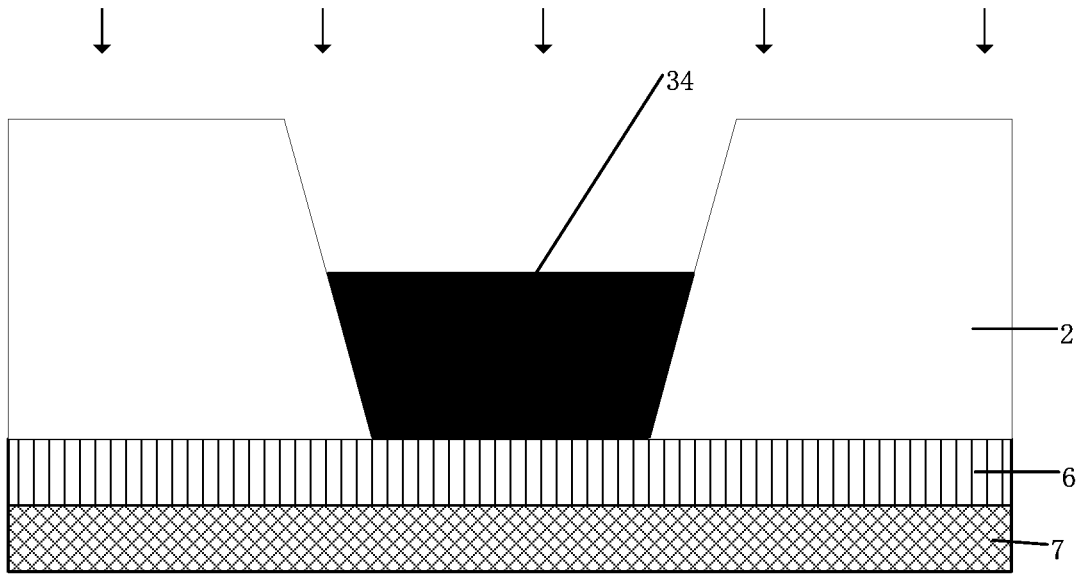
Figure 12:
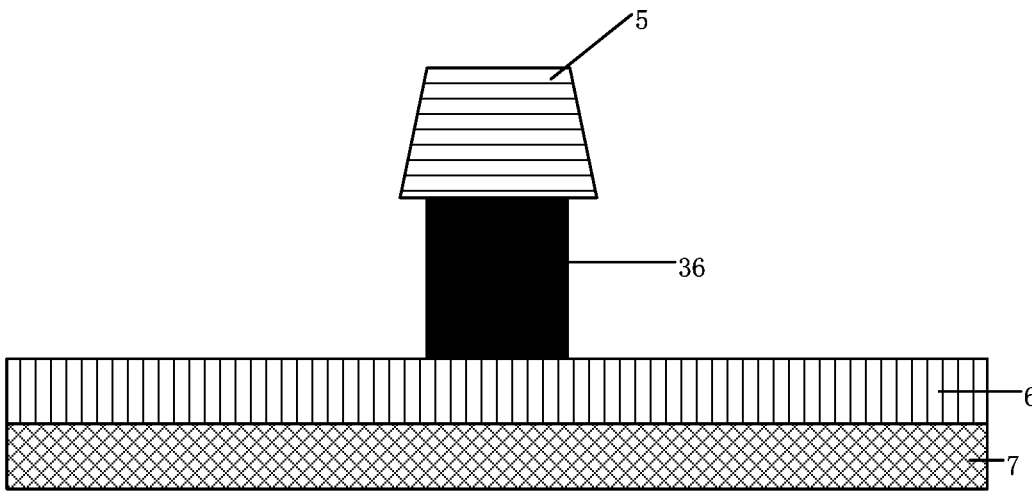

FIGS. 10 to 12 disclose another specific embodiment of the above method for manufacturing the metal wire. This embodiment is similar to the embodiment shown in FIGS. 2 to 9, except that a substrate made of a different material is used and the substrate is treated accordingly before the sacrificial layer is formed.

As shown in FIG. 10, the substrate is made of a Cyclo Olefin Polymer (COP) optical material. That is, the substrate is a COP substrate 7. Optical material COP has the following characteristics: high transparency, low birefringence, low water absorption, high rigidity, high heat resistance, and good air tightness of water vapor, which meets FDA (U.S. Food and Drug Administration) standards.

Before forming a sacrificial layer 2, an ashing barrier layer 6 may be formed on the COP substrate 7. The ashing barrier layer 6 may be made of silicon nitride (SiN), silicon oxide (SiO), or the like. A thickness of the ashing barrier layer 6 may be 100 nanometers (nm). The ashing barrier layer 6 may be deposited by a plasma enhanced chemical vapor deposition (PECVD) process. The material, thickness and forming process of the ashing barrier layer are not limited to this, as long as the COP substrate 7 below can be protected in the subsequent process of ashing and removing of the sacrificial layer 2.

Then, the sacrificial layer 2 is formed on the ashing barrier layer 6, and a groove is formed in the sacrificial layer 2. A metal material is deposited on the sacrificial layer 2, and a metal material layer 3 formed by deposition is both formed on the sacrificial layer 2 and filled in the groove, but the groove is not fully filled. Then, the groove is filled with photoresist 4, and excess photoresist 4 is also formed on the metal material layer 3 outside the groove. An upper surface of the photoresist 4 is flat as a whole. The entire surface of the photoresist 4 is ashed with oxygen plasma ($O_2$ plasma).

As shown in FIG. 11, by controlling ashing time, the photoresist 4 outside the groove is completely removed, but the photoresist 4 (photoresist pattern) is still retained on the metal material layer 3 in the groove. Then, wet etching is performed to remove the metal material outside the groove, and the photoresist 4 remaining above the metal material in the groove is removed. The metal material still remaining in the groove at this time is a metal bar 34 to be further etched subsequently.

As shown in FIG. 12, the sacrificial layer 2 is removed by ashing, and sidewalls of the metal bar 34 are exposed. A mask 5 is formed on the metal bar 34. Under a protection of the mask 5, the metal bar 34 is wet etched to a saturation state to form a metal wire 36.

The above-mentioned forming of the sacrificial layer 2 and the subsequent processing steps are the same as those in the embodiment shown in FIGS. 2 to 9, which will not be described in detail here and can be referred to the foregoing contents.

FIGS. 13 to 17 disclose yet another specific embodiment of the above method for manufacturing the metal wire.

Figure 13:
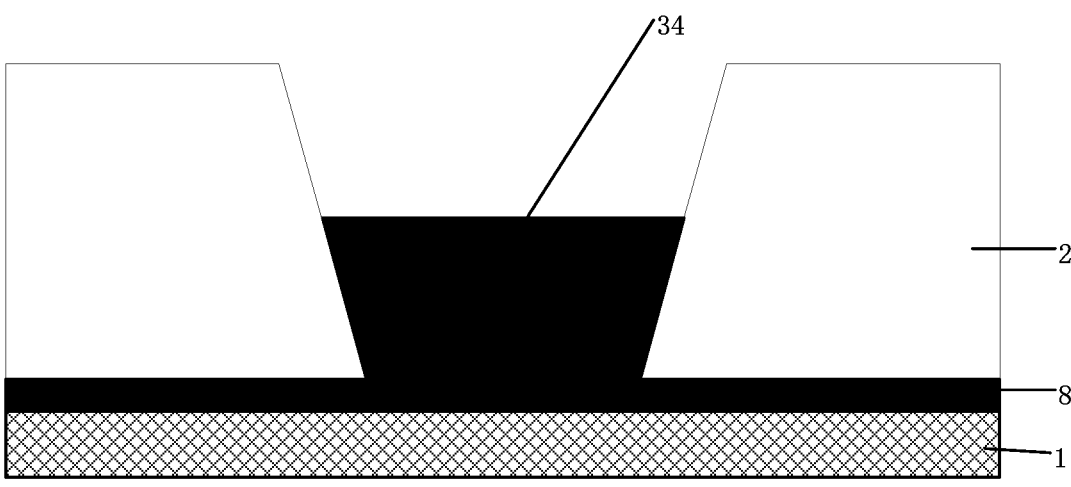
FIGS. 13 to 17 are schematic structural diagrams illustrating a method for manufacturing a metal wire according to yet another embodiment of the present disclosure.

As shown in FIG. 13, a substrate 1 is provided, and the substrate 1 is glass. In other embodiments, the substrate can also be other rigid or flexible substrate. A metal seed layer 8 is first deposited on the substrate 1. The metal seed layer 8 may be made of copper, and a thickness may be 4000 angstroms (Å). The pre-formed metal seed layer 8 can facilitate the subsequent electroplating process.

A sacrificial layer 2 is formed on the metal seed layer 8, and a groove is formed in the sacrificial layer 2. The sacrificial layer 2 is made of a light-sensitive organic material, and the groove can be formed in the sacrificial layer 2 by photolithography (including exposure, development, etc.). The groove penetrates through the sacrificial layer in a thickness direction and exposes the metal seed layer. In other embodiments, the sacrificial layer can also be made of other organic materials or inorganic materials, as long as it is convenient to form the groove in the sacrificial layer and remove the sacrificial layer in the subsequent process. The formed groove has a first section in a shape of isosceles trapezoid that is wide at a top and narrow at a bottom. In other embodiments, the first section of the groove can also have other shapes. However, when the first section is wide at a top and narrow at a bottom as a whole, the finally obtained metal wire has better performance in both shape stability and narrow line width. In the embodiment shown in the drawings, a width of a top of the groove (i.e., a width at the widest part) is about 7 microns (μm), a width of a bottom of the groove (i.e., a width at the narrowest part) is about 4.5 microns (μm), and a thickness (i.e., a depth) of groove is about 5 microns (μm). However, the present disclosure is not limited to this.

A metal material is formed in the groove by electroplating. Due to the influence of the metal seed layer 8 and the sacrificial layer 2, the metal material is not formed outside the groove. The metal material may be a metal material with high conductivity such as aluminum (Al), copper (Cu), or silver (Ag). In the embodiment shown in the drawings, the metal material is copper and has a thickness of about 2 microns (μm). The metal material formed by electroplating is a metal bar 34, and a shape of a section of the metal bar 34 corresponding to the first section of the groove is the same as or basically the same as that of the first section.

Figure 14:
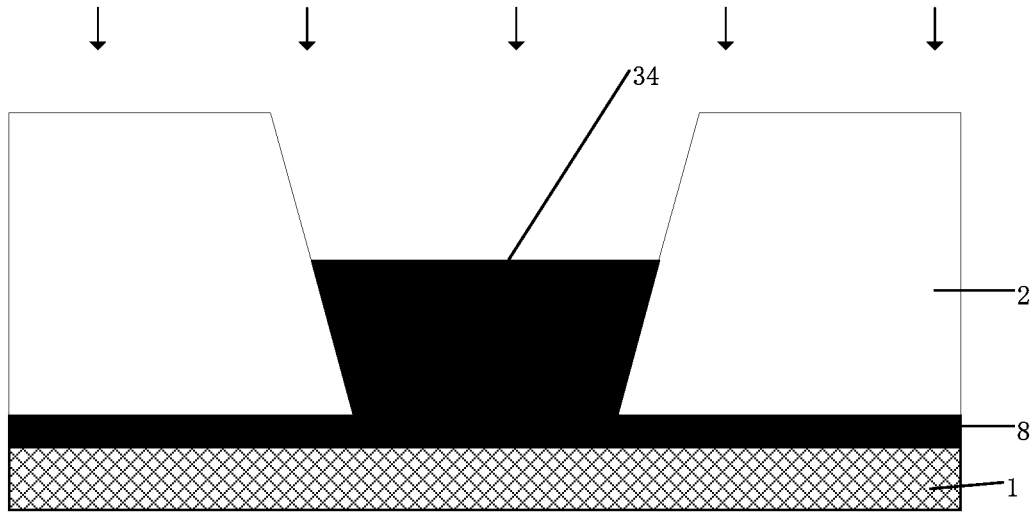
Figure 15:
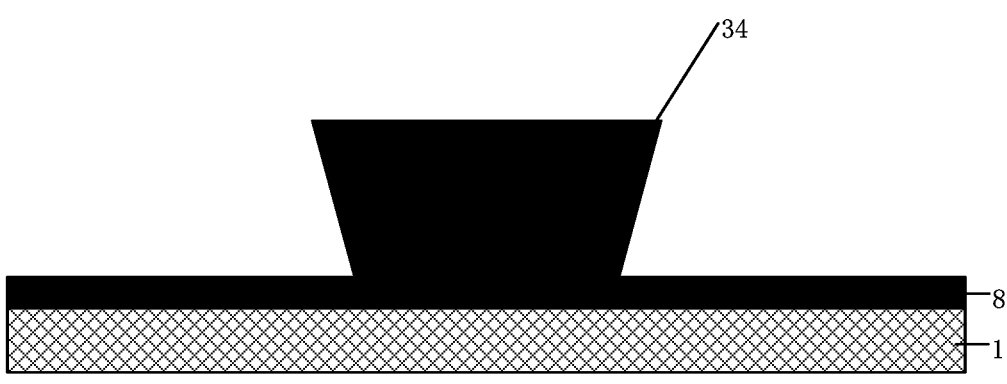

As shown in FIG. 14, the sacrificial layer 2 can be removed by ashing with oxygen plasma ($O_2$ plasma). After the sacrificial layer 2 is removed, sidewalls of the metal bar 34 are exposed. A width of an upper surface of the metal bar 34 is slightly smaller than the width of the top of the groove, that is, the width of the upper surface of the metal bar 34 is slightly smaller than 7 microns (μm). The formed structure is shown in FIG. 15.

Figure 16:
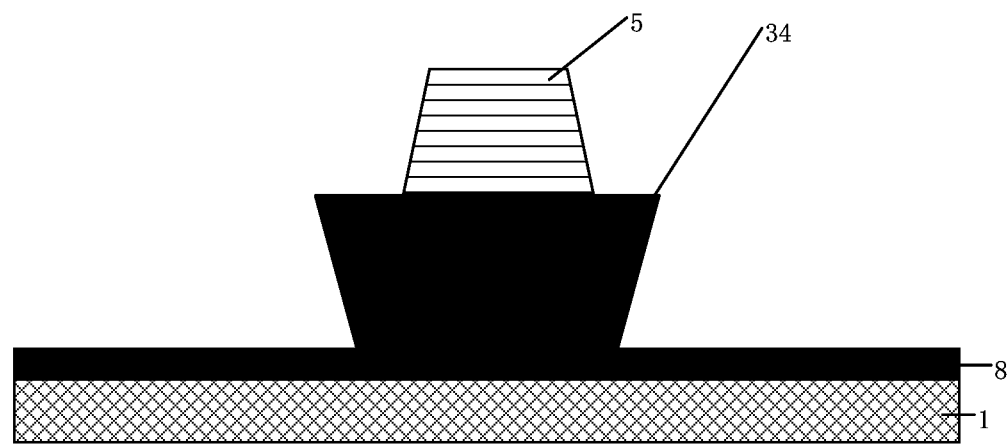

As shown in FIG. 16, a mask 5 is formed on the metal bar 34. A width of the mask 5 is smaller than a width of the metal bar 34, and an orthographic projection of the mask 5 on the substrate 1 is within an orthographic projection of the metal bar 34 on the substrate 1, so that in a width direction, the mask 5 covers an upper surface of a middle area of the metal bar 34 and exposes an upper surface of an edge area of the metal bar 34. In specific implementation, the width of the mask 5 can be designed to be 4 to 6 microns larger than a width of the final required metal wire, that is, both sidewalls of the mask 5 in the width direction protrude outward by 2 to 3 microns relative to sidewalls of the final required metal wire.

The mask 5 is a photoresist pattern formed after exposure and development of photoresist (i.e., photolithography). In other embodiments, the mask may also be a hard mask or other film layer, as long as it can protect the upper surface of the metal bar 34 to a certain extent in the subsequent wet etching process.

In the embodiment shown in the drawings, the mask 5 has a second section in a shape of isosceles trapezoid that is narrow at a top and wide at a bottom. The second section extends along a width direction of the mask 5 and is perpendicular to an upper surface of the substrate 1. The shape of the second section of the mask 5 is not limited to this. For example, the second section can be in a shape of rectangle, a non-isosceles trapezoid, etc. However, when the second section of the mask 5 is narrow at the top and wide at the bottom, it is more beneficial to obtain a metal wire with a narrower line width in the subsequent wet etching process.

Figure 17:
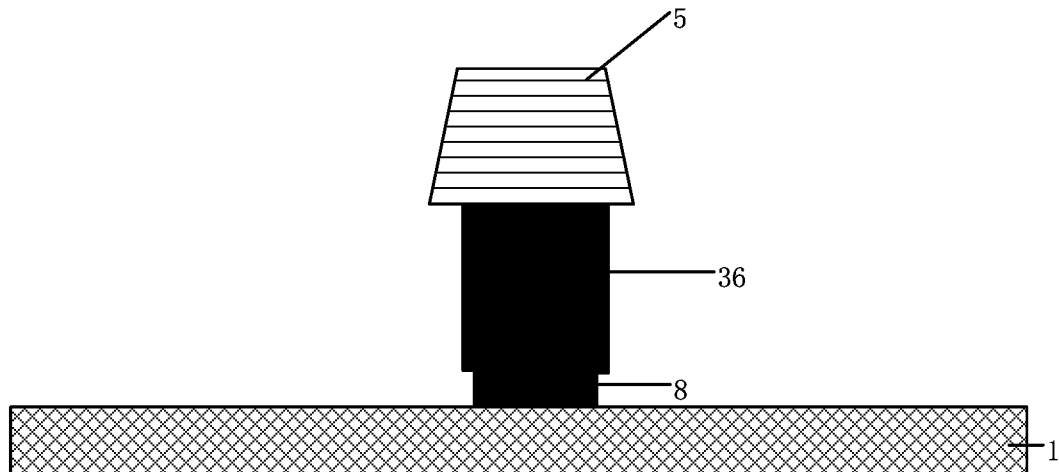

Then, under a protection of the mask 5, referring to FIG. 17, the metal bar 34 is wet etched to a saturation state to form a metal wire 36. A width of the metal wire 36 is smaller than the width of the mask 5. The width (i.e., line width) of the finally obtained metal wire 36 is about 1.5 microns (μm).

In the above etching, with the continuous progress of etching, the saturation state of etching will appear. After reaching the saturation state of etching, even if etching time is greatly increased, an etching result of the metal bar 34 cannot be significantly changed, and a smaller line width cannot be obtained.

In the above etching process, the appearance of the saturation state of etching is due to the special positional relationship between the mask 5 and the metal bar 34 as well as slowdown of lateral etching caused by a surface tension and diffusion of etching solution. In addition, the above process is relatively stable, that is, after reaching the saturation state of etching, the line width of each part of the metal wire is basically kept at the same level usable for production, and etching results obtained in different batches are also basically stable. With this point, the above method can obtain the metal wire 36 with a high thickness and a narrow line width, and the metal wire 36 has a high evenness of the line width.

It is noted that after reaching the saturation state, it does not mean that continued etching can no longer consume the metal bar 34 at all, but it means that an etching speed that can be obtained by continued etching will be much weaker than that of the previous stable etching stage. Therefore, even if continued etching is kept for a limited period of time, the effect on the final etching result of the metal bar 34 is very small. For example, when the etching speed is significantly lower than the speed or average speed of the previous stable etching stage, such as less than one third of the average speed of the stable etching stage, it can be considered that the saturation state of etching has been reached.

In the above process of wet etching the metal bar 34 to the saturation state to form the metal wire 36, an exposed part of the metal seed layer 8 will be synchronously etched. The formed structure is shown in FIG. 17.

Figure 18:
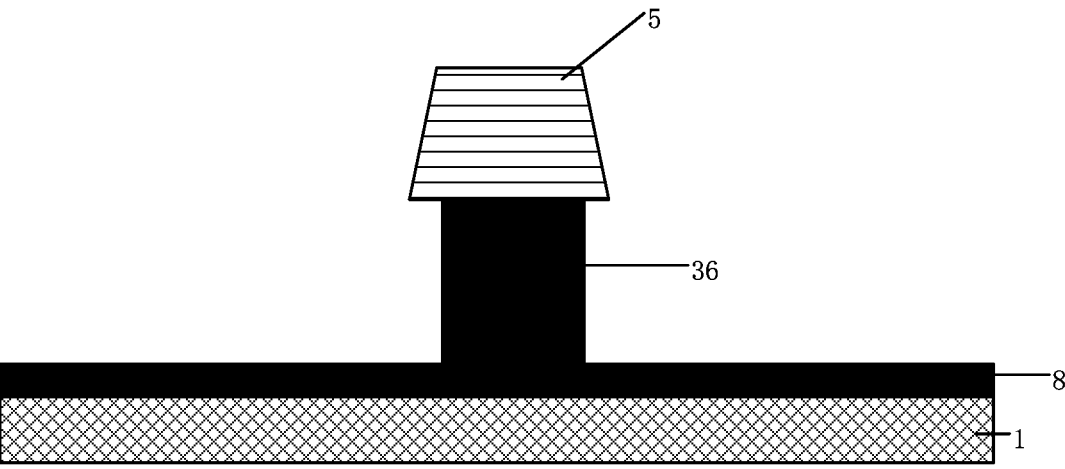
FIGS. 18 to 20 are schematic structural diagrams illustrating a method for manufacturing a metal wire according to yet another embodiment of the present disclosure.
Figure 19:
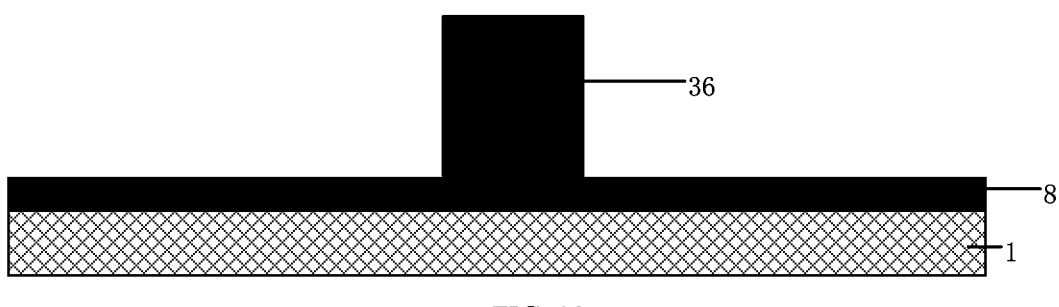
Figure 20:
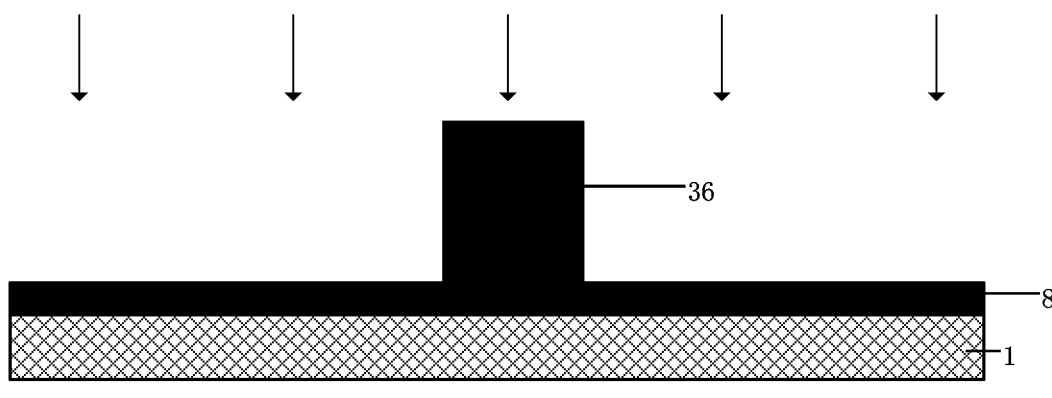

In other embodiments, if the metal seed layer 8 cannot be synchronously removed by the above wet etching process, an area of the metal seed layer 8 that is not close to the metal wire 36 may be removed through a separate step. The specific process is shown in FIGS. 18 to 20. As shown in FIGS. 18 and 19, the mask 5 above the metal wire 36 may be stripped first. The stripping method may be ashing with oxygen plasma. Then, as shown in FIG. 20, the metal seed layer 8 outside an area where the metal wire 36 is located is removed by a dry etching process. In the above dry etching process, the metal wire 36 or another photoresist pattern can be used as a mask. The adopted etching process may be reactive ion etching (ME), inductively coupled plasma (ICP) etching, ion beam etching (IBE), etc.

FIGS. 21 to 24 disclose another specific embodiment of the above method for manufacturing the metal wire.

Figure 21:
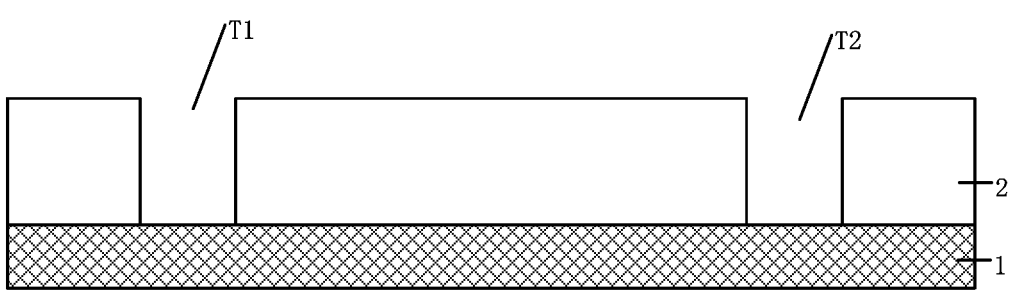
FIGS. 21 to 24 are schematic structural diagrams illustrating a method for manufacturing a metal wire according to yet another embodiment of the present disclosure.

As shown in FIG. 21, a substrate 1 is provided, and the substrate 1 is glass. In other embodiments, the substrate can also be other rigid or flexible substrate.

A sacrificial layer 2 is formed on the substrate 1. A first groove T1 and a second groove T2 are formed in the sacrificial layer 2, and the first groove T1 and the second groove T2 are separated from each other. The sacrificial layer 2 is made of a light-sensitive organic material, and the first groove T1 and the second groove T2 can be synchronously formed in the sacrificial layer 2 by photolithography (including exposure, development, etc.). The groove T1 and the second groove T2 penetrate through the sacrificial layer in a thickness direction. In other embodiments, the sacrificial layer can also be made of other organic materials or inorganic materials, as long as it is convenient to form the first groove T1 and the second groove T2 in the sacrificial layer and remove the sacrificial layer in the subsequent process.

Sections of the formed first groove T1 and the second groove T2 may be in a shape of rectangular. Slopes of sidewalls of the first groove T1 and the second groove T2 are steep, ranging from 80 degrees (inclusive) to 90 degrees (inclusive). Post-exposure underdevelopment can be used to enhance and achieve the steep slopes. The first groove and the second groove can also be formed by pressing and stamping, and the slopes of the first groove and the second groove can be ensured.

In specific implementation, a width of the first groove T1 and the second groove T2 is 2 microns (μm) or more (including 2 μm), and a thickness (depth) is 1 micron or more (including 1 μm), which is beneficial to the realization that metal deposited in the first groove and the second groove is not adhered to metal outside the first groove and the second groove, thus being beneficial to the quality of the finally formed metal wire.

Figure 22:
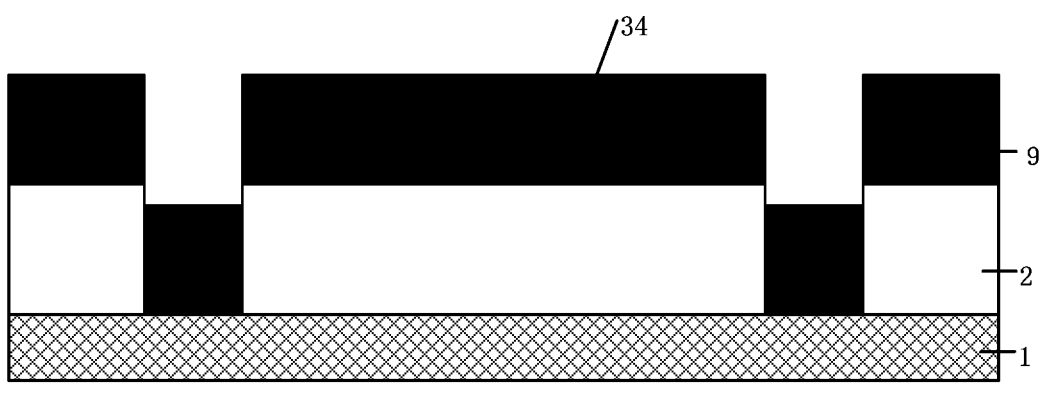

As shown in FIG. 22, a metal material is deposited on the sacrificial layer 2, and a deposited thickness meets requirements for design and production. The metal material can be deposited by DC sputtering or evaporation, and the deposited metal may be a metal material with high conductivity such as aluminum (Al), copper (Cu), or silver (Ag), etc. In the embodiment shown in the drawings, the deposited metal material is aluminum with a thickness of about 2 microns (μm). A metal material layer 9 formed by deposition is both formed on the sacrificial layer 2 and filled in the first groove T1 and the second groove T2. As a preferred embodiment, the metal material layer 9 preferably does not fully fill the first groove T1 and the second groove T2. Due to the steep slopes, the sidewalls of the first groove T1 and the second groove T2 are not adhered or hardly adhered to the metal material. The metal material above the sacrificial layer 2 between the first groove T1 and the second groove T2 serves as a metal bar 34. As shown in FIG. 22, the metal bar 34 is not adhered to the metal material layers 9 in other areas.

Figure 23:
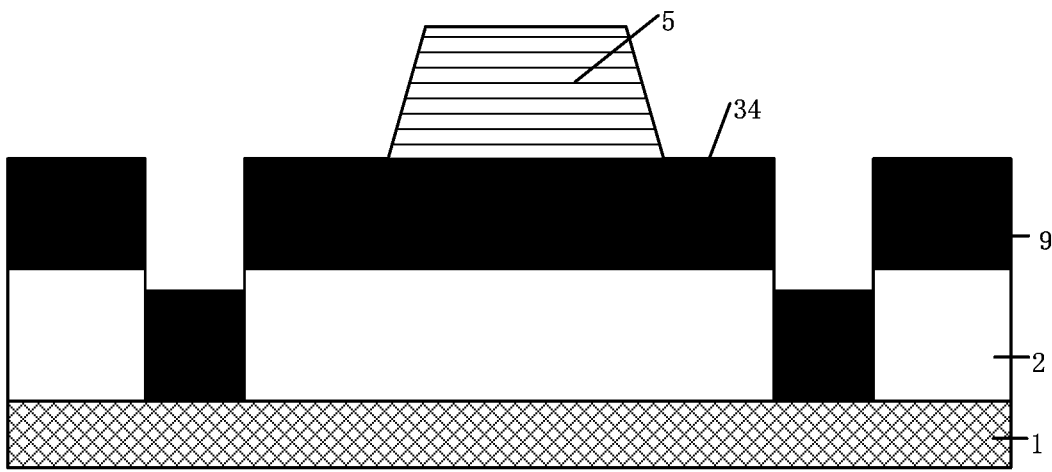

As shown in FIG. 23, a mask 5 is formed on the metal bar 34. A width of the mask 5 is smaller than a width of the metal bar 34, and an orthographic projection of the mask 5 on the substrate 1 is within an orthographic projection of the metal bar 34 on the substrate 1, so that in a width direction, the mask 5 covers an upper surface of a middle area of the metal bar 34 and exposes an upper surface of an edge area of the metal bar 34. In specific implementation, the width of the mask 5 can be designed to be 4 to 6 microns larger than a width of the final required metal wire, that is, both sidewalls of the mask 5 in the width direction protrude outward by 2 to 3 microns relative to sidewalls of the final required metal wire.

The mask 5 is a photoresist pattern formed after exposure and development of photoresist (i.e., photolithography). In other embodiments, the mask may also be a hard mask or other film layer, as long as it can protect the upper surface of the metal bar 34 to a certain extent in the subsequent wet etching process.

In the embodiment shown in the drawings, the mask 5 has a second section in a shape of isosceles trapezoid that is narrow at a top and wide at a bottom. The second section extends along a width direction of the mask 5 and is perpendicular to an upper surface of the substrate 1. The shape of the second section of the mask 5 is not limited to this. For example, the second section can be in a shape of rectangle, a non-isosceles trapezoid, etc. However, when the second section of the mask 5 is narrow at the top and wide at the bottom, it is more beneficial to obtain a metal wire with a narrower line width in the subsequent wet etching process.

Figure 24:
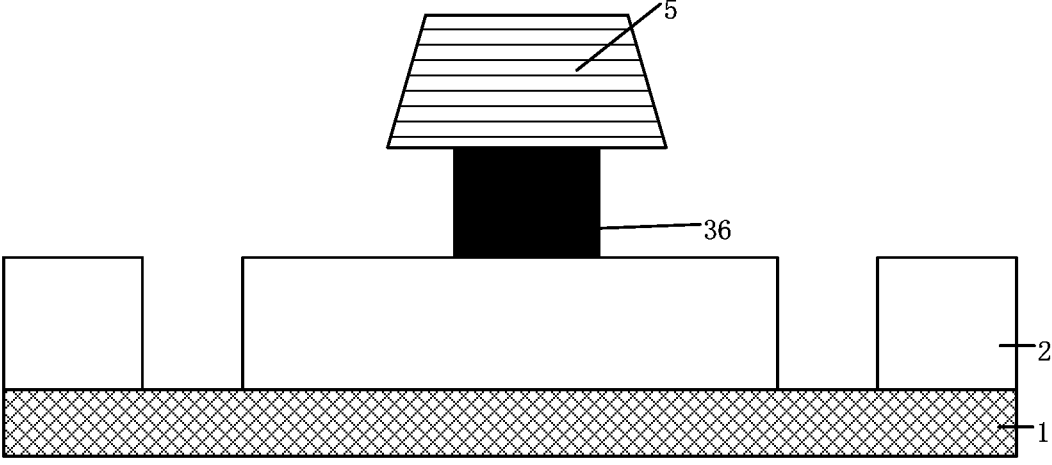

As shown in FIG. 24, under a protection of the mask 5, the metal bar 34 and the metal material layer 9 in other areas are wet etched to a saturation state to form a metal wire 36. A width of the metal wire 36 is smaller than the width of the mask 5. The width (i.e., line width) of the finally obtained metal wire 36 is about 1.5 microns (μm).

In the above etching, with the continuous progress of etching, the saturation state of etching will appear. After reaching the saturation state of etching, even if etching time is greatly increased, an etching result of the metal bar 34 cannot be significantly changed, and a smaller line width cannot be obtained.

In the above etching process, the appearance of the saturation state of etching is due to the special positional relationship between the mask 5 and the metal bar 34 as well as slowdown of lateral etching caused by a surface tension and diffusion of etching solution. In addition, the above process is relatively stable, that is, after reaching the saturation state of etching, the line width of each part of the metal wire is basically kept at the same level usable for production, and etching results obtained in different batches are also basically stable. With this point, the above method can obtain the metal wire 36 with a high thickness and a narrow line width, and the metal wire 36 has a high evenness of the line width.

It is noted that after reaching the saturation state, it does not mean that continued etching can no longer consume the metal bar 34 at all, but it means that an etching speed that can be obtained by continued etching will be much weaker than that of the previous stable etching stage. Therefore, even if continued etching is kept for a limited period of time, the effect on the final etching result of the metal bar 34 is very small. For example, when the etching speed is significantly lower than the speed or average speed of the previous stable etching stage, such as less than one third of the average speed of the stable etching stage, it can be considered that the saturation state of etching has been reached.

In the etching of a metal material in the related art, an etching slope of a profile of the metal material is about 45 degrees, which is caused by a difference in etching speeds between upper and lower surfaces of the metal material. In the above process of the present disclosure, for the metal bar between the first groove and the second groove, the contact between upper and lower parts of profiles of the metal bar and etching solution is basically the same. Therefore, the difference in etching speeds between the upper and lower parts of the profiles is small, and finally a metal wire structure with a narrow line width and a high thickness can be realized.

Figure 25:
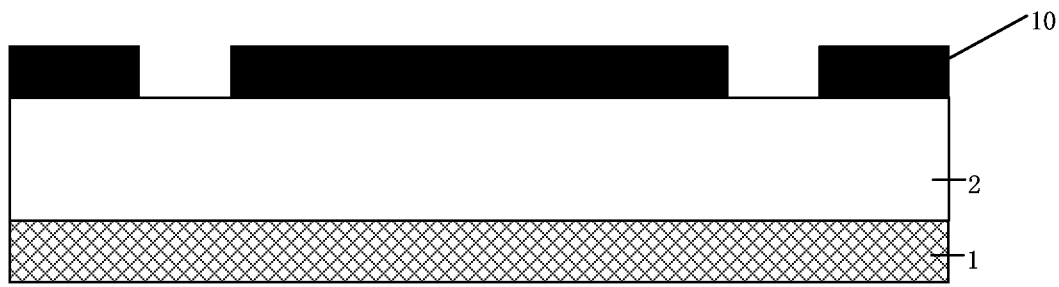
FIGS. 25 to 27 are schematic structural diagrams illustrating a method for manufacturing a metal wire according to yet another embodiment of the present disclosure.
Figure 26:
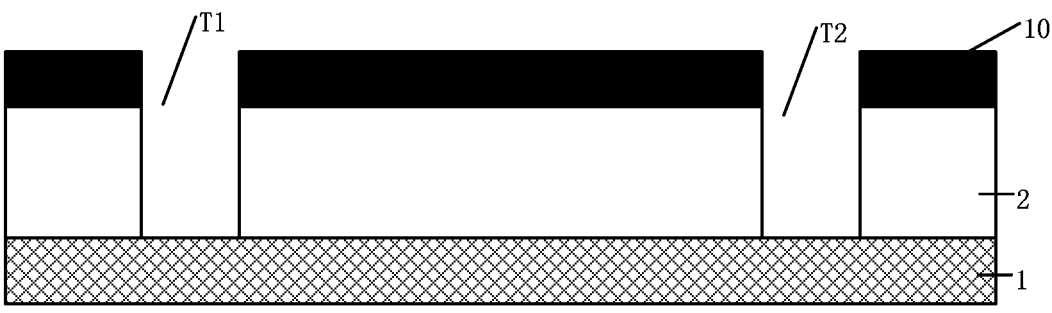
Figure 27:
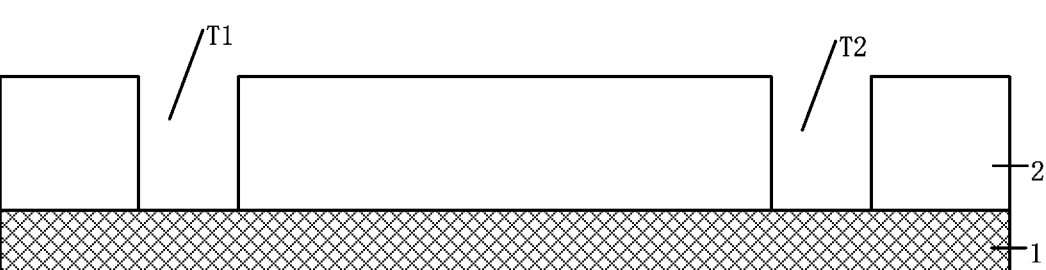

FIGS. 25 to 27 disclose yet another specific embodiment of the above method for manufacturing the metal wire. This embodiment is basically the same as the embodiment shown in FIGS. 21 to 24, except that methods of forming the first groove and the second groove are different, and other steps are completely the same.

As shown in FIG. 25, after forming an entire sacrificial layer 2 on a substrate 1, a hard mask 10 is first formed on the sacrificial layer 2, and the hard mask 10 is formed with openings corresponding to the first groove and the second groove. The hard mask 10 may be made of molybdenum (Mo), aluminum (Al), indium tin oxide (ITO), or indium gallium zinc oxide (IGZO). There is a large etching selectivity between the hard mask 10 and the sacrificial layer 2. In the embodiment shown in the drawings, the hard mask 10 is an indium tin oxide film layer with a thickness of 1350 angstroms.

As shown in FIG. 26, the sacrificial layer 2 is dry etched with the hard mask 10 to form the first groove T1 and the second groove T2 in the sacrificial layer 2. Since the etching selectivity between the hard mask 10 and the sacrificial layer 2 is large, it can be ensured that the first groove T1 and the second groove T2 have excellent precision in the above dry etching, and slopes of sidewalls of the first groove T1 and the second groove T2 can be well achieved.

As shown in FIG. 27, the hard mask 10 may be removed before depositing the metal material. Subsequent steps and/or processes, for example, depositing a metal material, forming a mask on a metal bar, and wet etching the metal bar to a saturation state under a protection of the mask, are the same as those in the embodiments of FIGS. 21 to 24.

Only one metal bar is shown in the above-mentioned embodiments, and it is introduced how to process the metal bar to produce a metal wire with a high thickness and a narrow line width. However, it is easy for those skilled in the art to understand that the above-mentioned manufacturing methods are also applicable to synchronously or asynchronously processing a plurality of independent or non-independent metal bars, so as to obtain a plurality of independent or non-independent metal wires with a high thickness and a narrow line width. That is, the above-mentioned simple changes to the embodiments of the present disclosure still fall within the protection scope of the present disclosure.

The present disclosure also provides a metal wire, which can be manufactured by any one of the above-mentioned methods. The metal wire can be applied to display devices, on-screen antennas on mobile terminals, photonic chips, gratings, polarization, and the like.

It should be noted that in the drawings, dimensions of layers and areas may be exaggerated for clarity of illustration. It will also be understood that when an element or layer is referred to as being "on" another element or layer, the element or layer can be directly on the another element or layer, or intervening layers may be present there-between. In addition, it will be understood that when an element or layer is referred to as being "under" another element or layer, the element or layer can be directly under the another element or layer, or there may be more than one intervening layers or elements. In addition, it will also be understood that when a layer or element is referred to as being "between" two layers or two elements, it can be the only layer between two layers or two elements, or there may also be more than one intervening layers or elements. Like reference numerals refer to like elements throughout.

Those skilled in the art will readily recognize other embodiments of the present disclosure upon consideration of the specification and practice of the present disclosure disclosed herein. The present disclosure is intended to cover any variations, uses, or adaptations of the present disclosure, which follow general principles of the present disclosure and include common knowledge or customary means in the art that are not disclosed in the present disclosure. The specification and embodiments are exemplary only, with the true scope and spirit of the present disclosure being indicated by the following claims.

It should be understood that the present disclosure is not limited to the precise structure that has been described above and shown in the drawings, and various modifications and changes may be made without departing from the scope thereof. The scope of the present disclosure is limited only by the appended claims.

The invention claimed is:

1. A method for manufacturing a metal wire, comprising:
forming a structure to be etched on a substrate, wherein the structure to be etched comprises a metal bar on a substrate and
a mask above the metal bar, a width of a surface of the mask in contact with the metal bar being smaller than a width of a surface of the metal bar in contact with the mask, a width of a surface of the metal bar in contact with the substrate being smaller than the width of the surface of the metal bar in contact with the mask, wherein an orthographic projection of the mask on the substrate is within an orthographic projection of the metal bar on the substrate; and wet etching the metal bar of the structure to be etched until an etching speed is lower than one third of an average speed of a stable etching stage under a protection of the mask, wherein when the etching speed is lower than one third of the average speed of the stable etching stage, a metal wire is formed, a width of the metal wire being smaller than the width of the mask; widths of the metal wire at different heights are the same, and a highest height of the metal wire is greater than each of the widths of the metal wire;
wherein forming the metal bar on the substrate comprises:
forming a sacrificial layer on the substrate, a groove being formed in the sacrificial layer; the groove has a first section perpendicular to the substrate in a width direction of the groove, and the first section is wide at a top and narrow at a bottom as a whole, wherein the width direction of the groove is parallel to the substrate;
filling a metal material in the groove to form the metal bar; and
removing the sacrificial layer;
wherein a direction of the width of the surface of the metal bar is parallel to the substrate, a direction of the width of the mask is parallel to the substrate, a direction of the width of the metal wire is parallel to the substrate, and a direction of the height of the metal wire is perpendicular to the substrate.

2. The method according to claim 1, wherein the sacrificial layer is made of a light-sensitive organic material, the groove is formed by photo-etching the sacrificial layer, and the sacrificial layer is removed by ashing.

3. The method according to claim 1, wherein the first section of the groove is in a shape of isosceles trapezoid.

4. The method according to claim 1, wherein filling the metal material in the groove comprises:
depositing the metal material on the sacrificial layer and in the groove;
forming a photoresist pattern covering the metal material in the groove and exposing the metal material outside the groove; and
perform etching under a protection of the photoresist pattern to remove the metal material outside the groove.

5. The method according to claim 1, wherein the mask has a second section perpendicular to the substrate in a width direction of the mask, and the second section is narrow at a top and wide at a bottom as a whole.

6. The method according to claim 5, wherein the second section of the mask is in a shape of isosceles trapezoid.

7. The method according to claim 1, wherein the substrate comprises a Cyclo Olefin Polymer (COP) optical material; and
an ashing barrier layer is formed on the substrate before forming the sacrificial layer on the substrate, and the sacrificial layer is formed on the ashing barrier layer.

8. The method according to claim 7, wherein the ashing barrier layer comprises silicon nitride or silicon oxide.

9. The method according to claim 1, wherein a metal seed layer is formed on the substrate before forming the sacrificial layer on the substrate, the sacrificial layer is formed on the metal seed layer, and the groove formed in the sacrificial layer exposes the metal seed layer; and
the metal material is filled in the groove by electroplating, and the metal material is not formed outside the groove.

10. The method according to claim 9, wherein in a process of wet etching the metal bar to form the metal wire, an exposed part of the metal seed layer is synchronously removed or not synchronously removed.

11. The method according to claim 1, wherein forming the metal bar on the substrate comprises:

forming a sacrificial layer on the substrate;

forming a first groove and a second groove in the sacrificial layer, the first groove and the second groove being separated from each other and arranged side by side; and depositing a metal material, wherein the metal material formed above the sacrificial layer between the first groove and the second groove serves as the metal bar.

12. The method according to claim 11, wherein the sacrificial layer is made of a light-sensitive organic material, and the first groove and the second groove are formed by photo-etching the sacrificial layer.

13. The method according to claim 11, wherein a width of the first groove and/or the second groove is greater than or equal to 2 microns, and slopes of sidewalls of the first groove and/or the second groove are greater than or equal to 80 degrees and less than or equal to 90 degrees.

14. The method according to claim 11, wherein a hard mask is formed on the sacrificial layer before forming the first groove and the second groove, and the hard mask is formed with openings corresponding to the first groove and the second groove; and the sacrificial layer is dry etched with the hard mask to form the first groove and the second groove in the sacrificial layer.

15. The method according to claim 14, wherein the hard mask is removed before depositing the metal material.

16. The method according to claim 14, wherein the hard mask comprises molybdenum, aluminum, indium tin oxide or indium gallium zinc oxide.

17. A metal wire manufactured by the method for manufacturing the metal wire according to claim 1.

* * * * *